United States Patent
Wang

(10) Patent No.: US 8,207,795 B2
(45) Date of Patent: Jun. 26, 2012

(54) DELAY CELL OF RING OSCILLATOR AND ASSOCIATED METHOD

(75) Inventor: Yao-Chi Wang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 12/410,751

(22) Filed: Mar. 25, 2009

(65) Prior Publication Data

US 2010/0134170 A1    Jun. 3, 2010

(30) Foreign Application Priority Data

Dec. 3, 2008 (TW) ................. 97147017 A

(51) Int. Cl.
*H03K 3/03* (2006.01)
(52) U.S. Cl. ............ 331/57; 331/17; 331/25; 331/177 R
(58) Field of Classification Search .................... 331/57, 331/17, 25, 36 C, 175, 177 R; 327/280, 281
See application file for complete search history.

(56) References Cited

U.S. PATENT DOCUMENTS

| | | | | |
|---|---|---|---|---|
| 6,222,423 | B1 * | 4/2001 | Sudjian | 331/57 |
| 6,462,623 | B1 * | 10/2002 | Horan et al. | 331/17 |
| 7,400,183 | B1 * | 7/2008 | Sivadasan et al. | 327/261 |
| 2006/0214739 | A1 * | 9/2006 | Kang | 331/57 |

OTHER PUBLICATIONS

State Intellectual Property Office of the People's Republic of China, "Office Action", Jan. 11, 2011, China.

* cited by examiner

*Primary Examiner* — Joseph Chang
*Assistant Examiner* — Jeffrey Shin
(74) *Attorney, Agent, or Firm* — WPAT., P.C.; Justin King

(57) ABSTRACT

A delay cell for use in a ring oscillator and associated method is provided. The delay cell includes a differential amplifier, a switched capacitance bank, and a Kvco equalizer. The differential amplifier comprises a differential pair, a first load and a second load. The differential pair includes a positive input terminal, a negative input terminal, a positive output terminal, and a negative output terminal. The first load is coupled to the positive output terminal, and the second load is coupled to the negative output terminal. The switched capacitance bank has a plurality of controlled capacitor paths selectively connecting to the positive output terminal or the negative output terminal according to a capacitance controlling signal. The Kvco equalizer has an adjustable current source for providing a current to the Kvco equalizer according to a current controlling signal to compensate currents flowing through the first load and the second load.

9 Claims, 7 Drawing Sheets

DELAY CELL OF RING OSCILLATOR AND ASSOCIATED METHOD

CROSS REFERENCE TO RELATED PATENT APPLICATION

This patent application is based on a Taiwan, R.O.C. patent application No. 097147017 filed on Dec. 3, 2008.

FIELD OF THE INVENTION

The present invention relates to a delay cell and an associated method, and more particularly, to a delay cell for use in a ring oscillator and an associated method.

BACKGROUND OF THE INVENTION

Referring to FIG. 1 showing a schematic diagram of a conventional phase-locked loop (PLL), the PLL comprises a phase frequency detector 10, a charge pump 20, a loop filter 30, a voltage-controlled oscillator (VCO) 40, and a frequency divider 45. A reference signal having a reference frequency $F_{ref}$, generated by a reference oscillator (not shown), for example, and a frequency divided signal from the frequency divider 45, are concurrently inputted into the phase frequency detector 10. The phase frequency detector 10 detects differences of the phase and the frequency between the reference signal and the frequency divided signal, and then outputs a phase difference signal to the charge pump 20. The charge pump 20 then generates an output current associated with the phase difference signal, according to the amplitude of the phase difference signal, to the loop filter 30. After smoothing the output current, the loop filter 30 converts the output current into a voltage control signal to the VCO 40. According to the control signal, the VCO 40 generates a voltage-controlled signal with a voltage-controlled frequency $F_{vco}$. The frequency divider 45 receives the voltage-controlled signal $F_{vco}$, and divides the same by N to generate a divided frequency signal, where $F_{vco}=N*F_{ref}$.

The VCO 40 typically includes two types, namely, an LC oscillator and a ring oscillator. An LC oscillator has an advantage of having a low phase noise, but disadvantages of having a large layout area and a narrow tuning range. In contrast, a ring oscillator has advantages of having a small layout area and a wide tuning range, but a disadvantage of having a high phase noise. For implementing an integrated circuit, a VCO in a PLL is commonly realized by a ring oscillator. If a VCO in a PLL is to be realized by using an LC oscillator, an additional pin is needed for connecting with inductance components.

FIG. 2 shows a circuit diagram of a ring oscillator comprising multi-stage delay cells. A phase shift between an input terminal and an output terminal of each stage delay cell is controlled by adjusting the voltage controlling signal to generate a desired frequency. Further, an output terminal of a preceding stage delay cell is coupled to an input terminal of a subsequent stage delay cell.

From FIG. 2, delay cells 102, 104 and 106 are identical differential amplifiers, and receive a voltage controlling signal Vc to control the phase shift of the delay cells 102, 104 and 106. The positive output terminals Vo+ of the delay cells 102 and 104 are coupled to the positive input terminals Vin+ of next-stage delay cells, respectively; the negative output terminals Vo− of the delay cells 102 and 104 are coupled to the negative input terminals Vin− of next-stage delay cells, respectively. The positive output terminal Vo+ of the delay cell 106 is coupled to the negative input terminal Vin− of the delay cell 102; the negative output terminal Vo− of the delay cell 106 is coupled to the positive input terminal Vin+ of the delay cell 102.

The foregoing delay cells are not limited to differential amplifiers; a single-end circuit, such as an inverter chain consisted of inverters, may also serve as delay cells in the VCO, in which the phase shift of the delay cells may be controlled by the voltage controlling signal.

In general, in the VCO, a constant ($\Delta f/\Delta V$) of a voltage-controlled frequency range over a controlling voltage is defined as Kvco. A voltage-controlled frequency of a conventional VCO is incapable of providing a constant Kvco. Kvco fluctuates according to changes in the controlling voltage. For circuit design, when Kvco fluctuates more seriously according to changes in the controlling voltage, the overall circuit design of the PLL gets more complicated. More particularly, a design of a preceding circuit unit coupled to the VCO, that is, the loop filter, gets extremely complicated. When Kvco fails to maintain at a constant value, the noise in the loop filter increases. Therefore, it is one of the objectives of the invention to provide a delay cell for use in a ring oscillator whereby a VCO is capable of providing a constant Kvco.

SUMMARY OF THE INVENTION

A delay cell for use in a ring oscillator according to the invention comprises: a differential amplifier, for generating a differential output; a switched capacitance bank, coupled to the differential amplifier, for providing capacitance according to a capacitance controlling signal; and a Kvco equalizer, coupled to the differential amplifier, for generating an adjustable current source according to a current controlling signal.

A method for adjusting an operating frequency of a ring oscillator according to the invention comprises coarse-tuning the operating frequency on a plurality of frequency bands, equalizing a plurality of Kvco values on the frequency bands, and fine-tuning the operating frequency.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
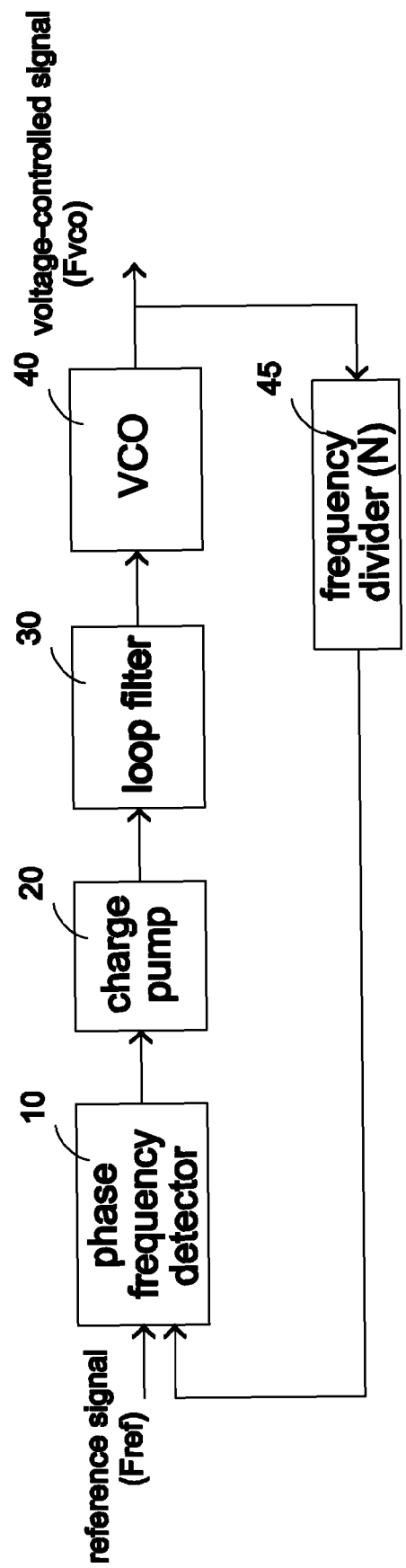
FIG. 1 is a schematic diagram of a phase-locked loop (PLL) in a conventional practice.
Figure 2:
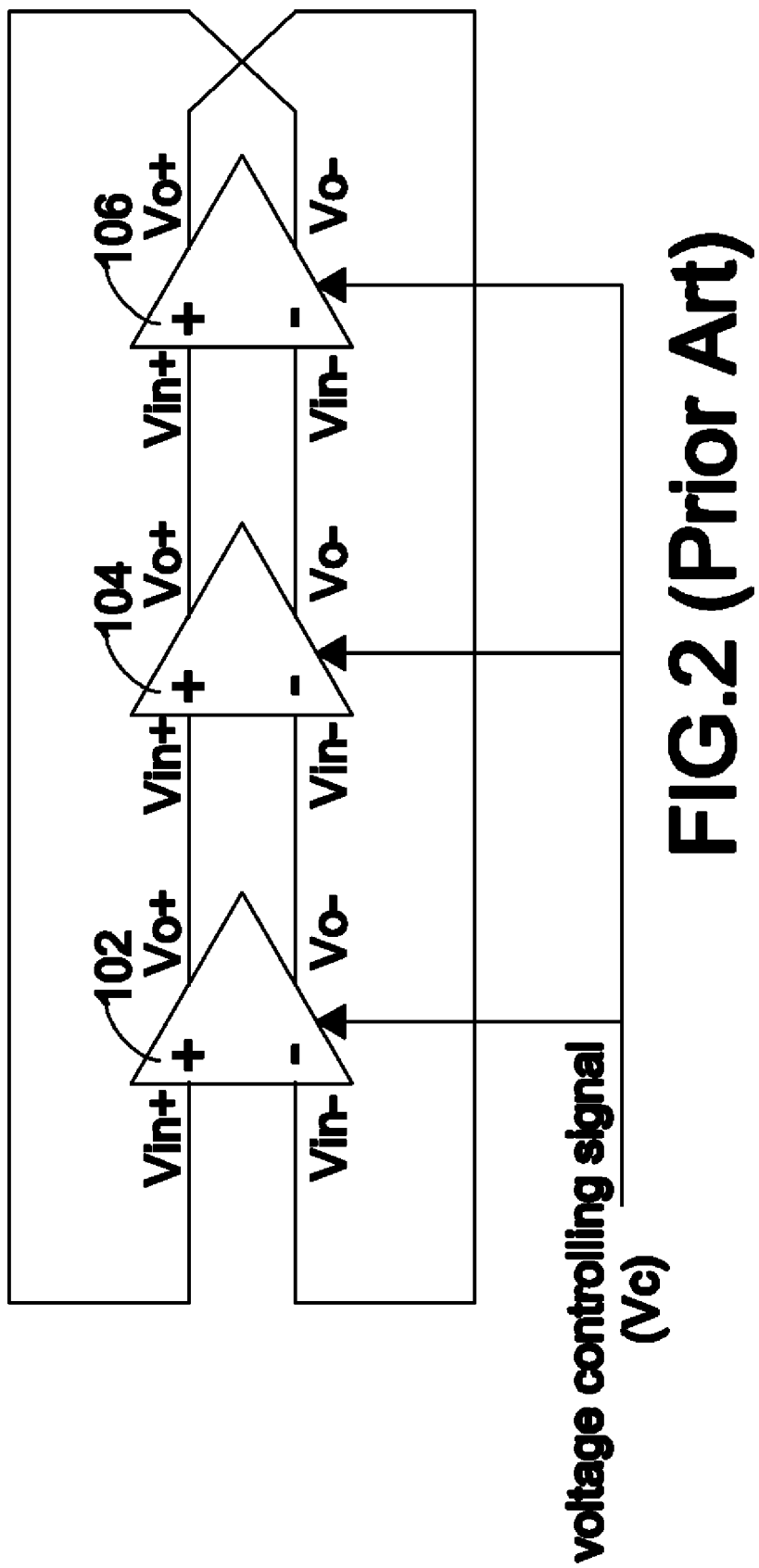
FIG. 2 is a circuit diagram of a ring oscillator in a conventional practice.
Figure 3A:
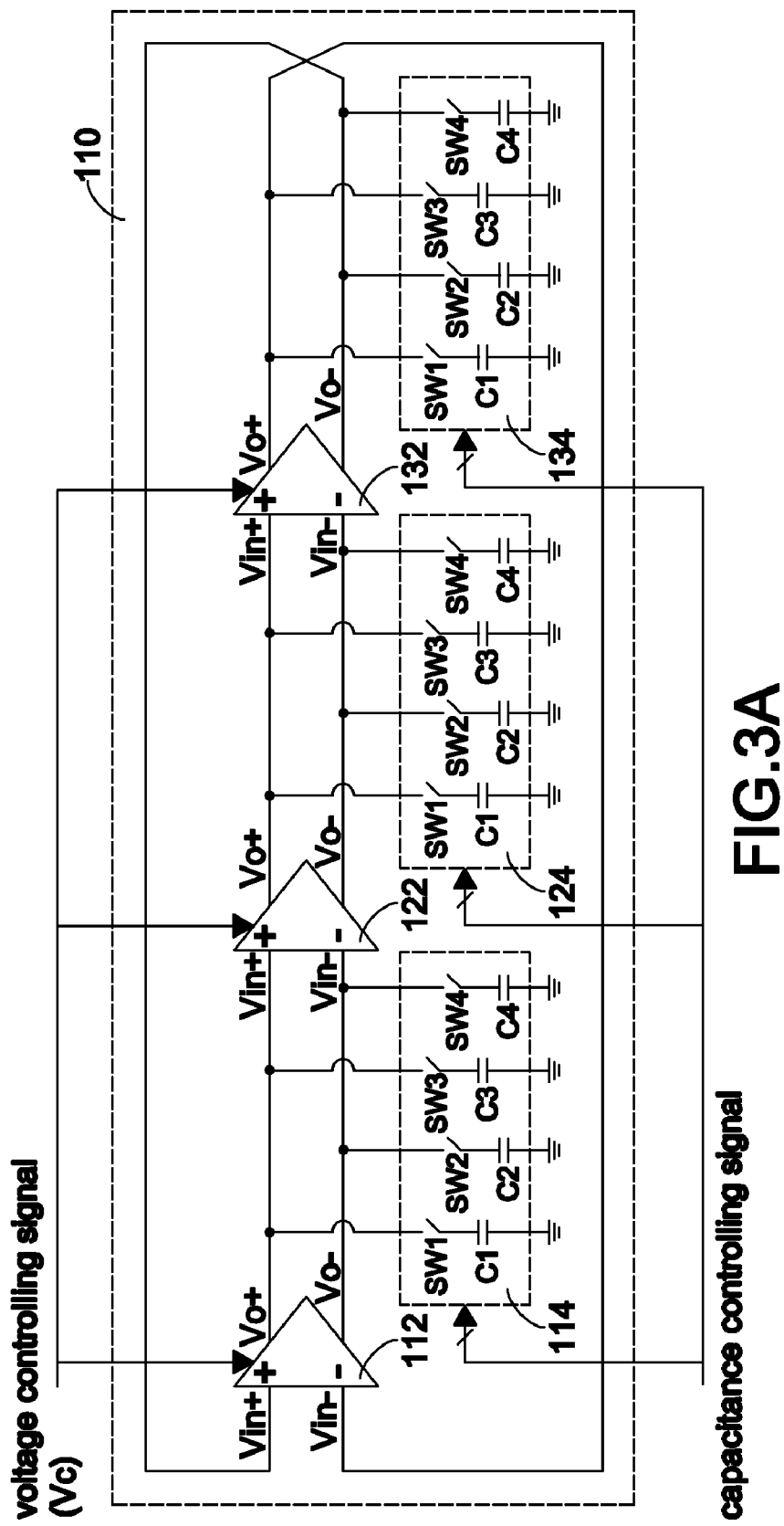
FIG. 3A is a circuit diagram of a ring oscillator having a wide frequency tuning range according to one embodiment of the invention.

Please refer to FIG. 3A showing a circuit diagram of a ring oscillator 110 having a wide frequency tuning range. The ring oscillator 110 comprises multi-stage delay cells, each of which comprises a differential amplifier and a switched capacitance bank. Further, the delay cell of each stage controls a phase shift between an input terminal and an output terminal thereof utilizing a voltage controlling signal Vc. The switched capacitance bank comprises a plurality of capacitors. A capacitance controlling signal controls connection of the capacitors between the positive output terminals of amplifiers and the ground, or between the negative output terminals of differential amplifiers and the ground.

Three amplifiers, namely, first differential amplifier 112, second differential amplifier 122 and third differential amplifier 132, are coupled to a voltage controlling signal Vc to control a phase shift of the delay cells.

The first differential amplifier 112 has the positive output terminal thereof coupled to the positive input terminal of the second differential amplifier 122, and the negative output terminal thereof connected to the negative input terminal of the second differential amplifier 122. The second differential amplifier 122 has the positive output terminal thereof coupled to the positive input terminal of the third differential amplifier 132, and the negative output terminal thereof coupled to the negative input terminal of the third differential amplifier 132. The third differential amplifier 132 has the positive output terminal thereof coupled to the negative input terminal of the first differential amplifier 112, and the negative output terminal thereof coupled to the positive input terminal of the first differential amplifier 112.

In this embodiment, three switched capacitance banks 114, 124, 134 in the delay cells are identical in structure. For example, the first capacitance bank 114 comprises four capacitors C1, C2, C3 and C4. A first switch SW1 controls connection of the first capacitor C1 between the positive output terminal of the differential amplifier and the ground. A second switch SW2 controls connection of the second capacitor C2 between the negative output terminal of the differential amplifier and the ground. The third switch SW3 controls connection of the third capacitor C3 between the positive output terminal of the amplifier and the ground. The fourth switch SW4 controls connection of the fourth capacitor C4 between the negative output terminal of the differential amplifier and the ground. The three switched capacitance banks 114, 124, and 134 receive a capacitance controlling signal. For example, when the capacitance controlling signal is at low level, the first switches SW1 in the three switched capacitance banks 114, 124 and 134 are turned off.

Figure 3B:
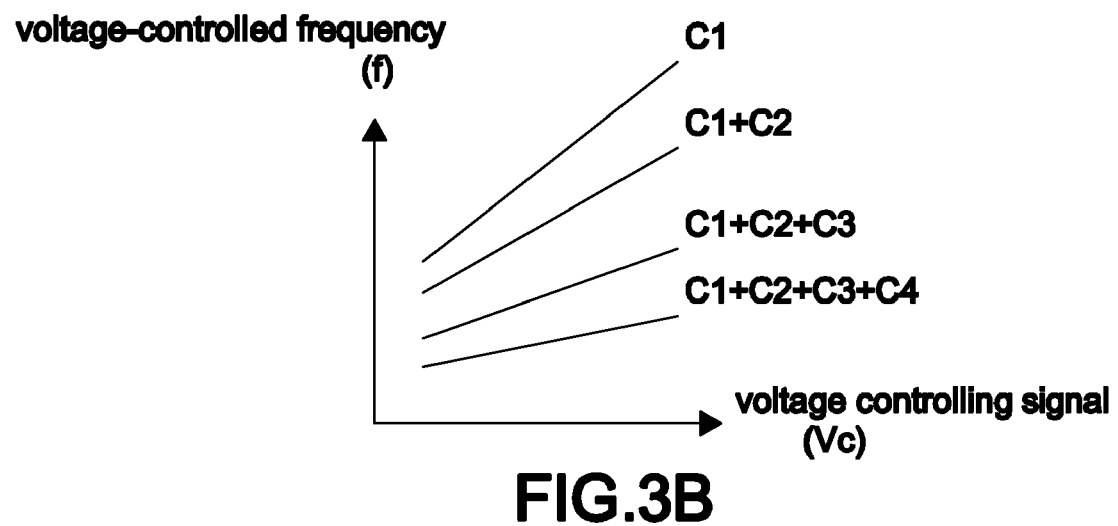
FIG. 3B is a diagram illustrating frequency tuning of a ring oscillator having a wide frequency tuning range according to one embodiment of the invention.

In general, the presence of a switched capacitance bank in a delay cell allows a ring oscillator with a wide frequency tuning range. Refer to FIG. 3B showing a diagram illustrating frequency tuning of a ring oscillator having a wide frequency tuning range, where the vertical axis represents an operating frequency of the ring oscillator, and the horizontal axis represents the voltage controlling signal Vc. As indicated in FIG. 3B, the greater the equivalent capacitance from the output terminal of the delay cell gets, the larger the phase shift between the output terminal and input terminal of the delay cell is resulted. Therefore, by controlling the equivalent capacitance of the parallel capacitors C1, C2, C3 and C4, the operating frequency of the ring oscillator can be coarse-tuned. As shown, based on different capacitance values provided by the switched capacitance bank, the ring oscillator may accordingly adjust the operating frequency on different frequency bands. Via the capacitance controlling signal, the switched capacitance bank is controlled to select the frequency band of the ring oscillator, and the voltage controlling signal may then fine-tune the operating frequency of the ring oscillator.

The ring oscillator shown in FIG. 3A has a wide frequency adjustment range. However, the Kvco of the ring oscillator is an inconstant value due to different frequency bands, thus noises in the loop filter are increased.

Figure 4A:
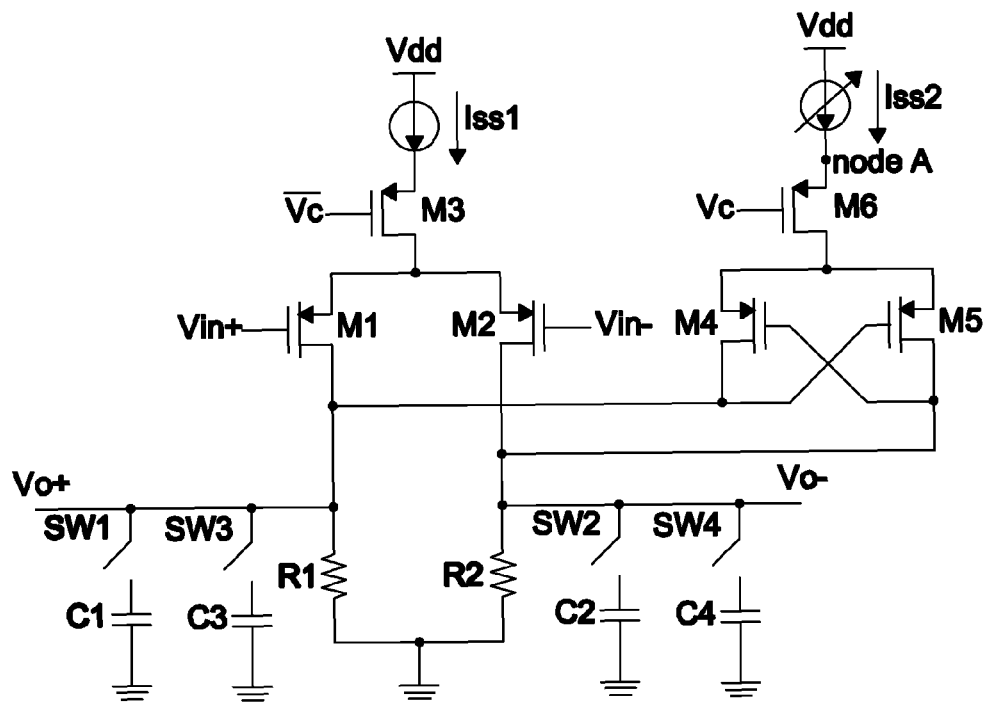
FIG. 4A shows a delay cell of a ring oscillator according to one embodiment of the invention.

FIG. 4A shows a delay cell of a ring oscillator according to one embodiment of the invention. The delay cell may be implemented to a ring oscillator having multi-stage delay cells, each of which possesses a structure as shown in FIG. 4A. The delay cell comprises a differential amplifier, a switched capacitance bank and a Kvco equalizer.

The differential amplifier comprises a differential pair, a first load R1 and a second load R2. The differential pair comprises a first current source Iss1, a first PMOS transistor M1, a second PMOS transistor M2 and a third PMOS transistor M3. The first current source Iss1 is coupled between a voltage supply Vdd and the source of the third PMOS transistor M3. The gate of the third PMOS transistor M3 receives an inverted voltage controlling signal $\overline{Vc}$ or a bias voltage. The drain of the third PMOS transistor M3 is coupled to the sources of the first PMOS M1 and the second PMOS transistor M2. The gate of the first PMOS transistor M1 is the positive input terminal Vin+ of the differential pair; the gate of the second PMOS M2 is the negative input terminal Vin− of the differential pair. The drain of the first PMOS transistor M1 is the positive output terminal Vo+ of the differential pair; the drain of the second PMOS transistor M2 is the negative output terminal Vo− of the differential pair. The first load R1 is coupled between the positive output terminal Vo+ of the differential pair and the ground. The second load R2 is coupled between the negative output terminal Vo− of the differential pair and the ground.

The switched capacitance bank comprises a plurality of capacitors, for example, four capacitors C1, C2, C3 and C4. A first switch SW1 selectively connects the first capacitor C1 between the positive output terminal of the differential amplifier and the ground. A second switch SW2 selectively connects the second capacitor C2 between the negative output terminal of the differential amplifier and the ground. The third switch SW3 selectively connects the third capacitor C3 between the positive output terminal of the differential amplifier and the ground. The fourth switch SW4 selectively connects the fourth capacitor C4 between the negative output terminal of the differential amplifier and the ground. Via a capacitance controlling signal, the four switches SW1, SW2, SW3 and SW4 are selectively turned on or turned off.

The Kvco equalizer comprises an adjustable current source Iss2, a fourth PMOS transistor M4, a fifth PMOS transistor M5 and a sixth PMOS transistor M6. The adjustable current source Iss2 is coupled between the voltage supply Vdd and a node A. The sixth PMOS transistor M6 has the source thereof coupled to the node A, the gate thereof receiving a voltage controlling signal Vc, and the drain thereof coupled to the sources of the fourth PMOS transistor M4 and the fifth PMOS transistor M5. The fourth PMOS transistor M4 has the gate thereof coupled to the drain of the fifth PMOS transistor and the negative output terminal Vo− of the differential pair. The fifth PMOS transistor M5 has the gate thereof coupled to the drain of the fourth PMOS transistor M4 and the positive output terminal Vo+ of the differential pair.

In this embodiment, as the equivalent capacitance from the output terminal of the delay cell gets greater, the adjustable current source Iss2 in the Kvco equalizer correspondingly provide a larger current to compensate the first load R1 and the second load R2. More specifically, by simultaneously controlling the capacitance controlling signal and the current controlling signal for the adjustable current source Iss2, the current of the adjustable current source Iss2 of the Kvco equalizer also gets larger as the capacitance from the switched capacitance bank gets larger.

Figure 4B:
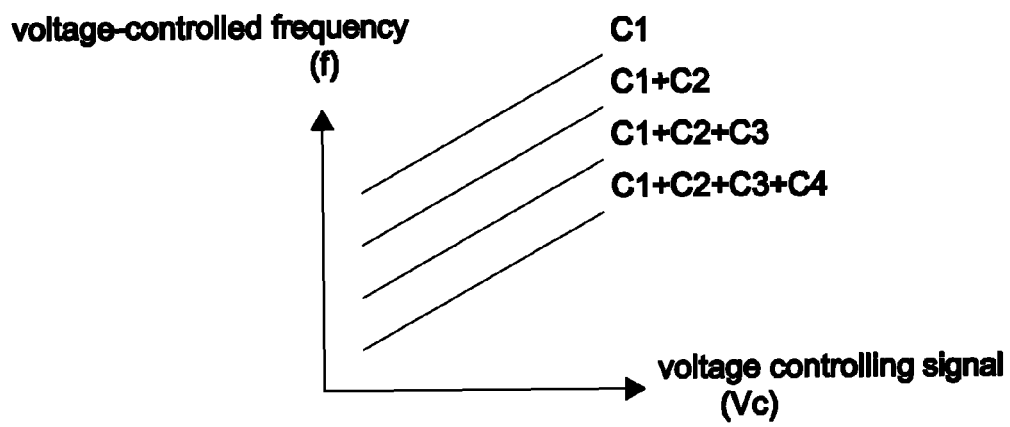
FIG. 4B is a diagram illustrating frequency tuning of a ring oscillator implementing a delay cell according to one embodiment of the invention.

Refer to FIG. 4B showing a diagram illustrating frequency tuning of a ring oscillator implementing a delay cell according to one embodiment of the invention. The vertical axis represents an operating frequency of the ring oscillator, and the horizontal axis represents a voltage controlling signal Vc. As the equivalent capacitance from the output terminal of the delay cell gets greater, the adjustable current source Iss2 in the Kvco equalizer correspondingly gets larger. By varying capacitance values provided by the switched capacitance bank, the ring oscillator is capable of adjusting the operating frequency on a desired frequency band, and compensating the current source Iss2 to maintain the Kvco for all frequency bands of the ring oscillator at a substantially fixed value. Therefore, the ring oscillator comprising the delay cell according to the invention is capable of providing a constant Kvco. For example, during a circuit design phase, design parameters of the current and the capacitance may be obtained through circuit simulation, so as to reduce noises in the loop filter as well as circuit complexity.

Figure 5:
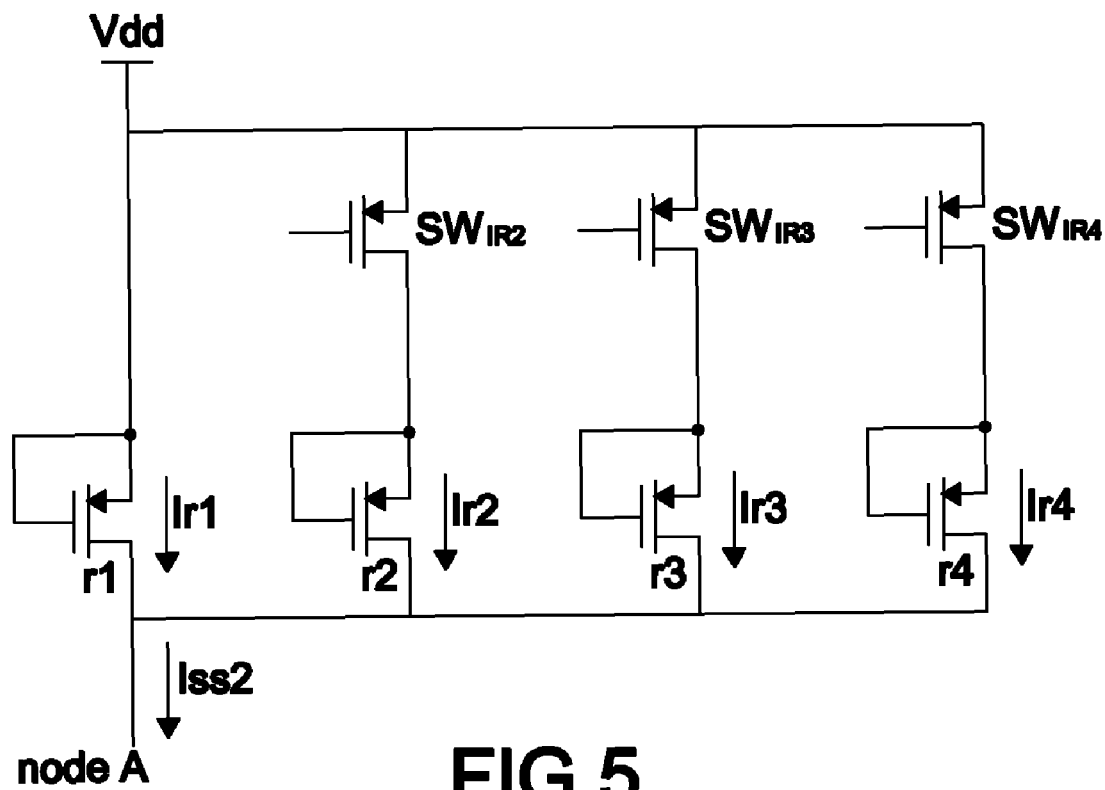
FIG. 5 is a circuit diagram of an adjustable current source according to one embodiment of the invention.

FIG. 5 shows a circuit diagram of an adjustable current source Iss2 according to one embodiment of the invention. The current source Iss2 includes a fixed current providing path Ir1, and a plurality of controlled current paths Ir2 to Ir4 coupled between a voltage supply Vdd and a node A. The fixed current providing path Ir1 is provided with a transistor resistor r1 allowing the fixed current providing path Ir1 to provide a fixed current. The controlled current paths Ir2 to Ir4 are provided with a second resistor r2, a third resistor r3 and a fourth resistor r4, respectively. Transistor switches $SW_{IR2}$, $SW_{IR3}$ and $SW_{IR4}$ are utilized to selectively conduct the controlled current paths Ir2 to Ir4 between the voltage supply Vdd and the node A. More specifically, a current controlling signal controls the transistor switches $SW_{IR2}$, $SW_{IR3}$ and $SW_{IR4}$ to further control the output current magnitude of the adjustable current source Iss2. For example, when the three transistor switches $SW_{IR2}$, $SW_{IR3}$ and $SW_{IR4}$ are turned on, the output current from the adjustable current source Iss2=Ir1+Ir2+Ir3+Ir4. Preferably, the resistors r1, r2, r3 and r4 are realized by long-channel p-type transistors. Each of the p-type transistors has the gate and source thereof coupled to each other, and the source and the drain forming two terminals of the resistor.

Figure 6:
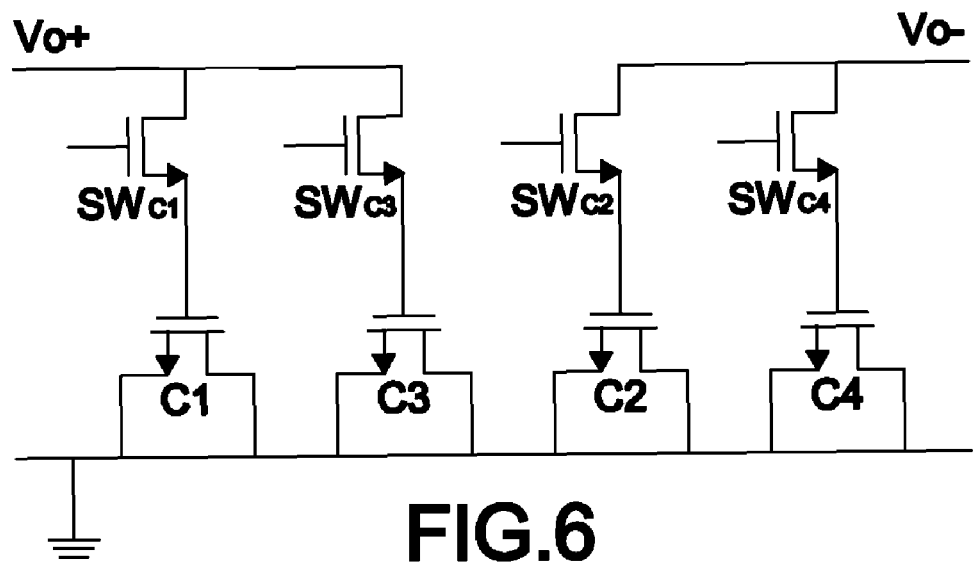
FIG. 6 is a circuit diagram of a switched capacitance bank according to one embodiment of the invention.

FIG. 6 is a circuit diagram of a switched capacitance bank according to one embodiment of the invention. The switched capacitance bank comprises a plurality of controlled capacitor paths. First and third controlled capacitor paths are respectively provided with a first capacitor C1 and a third capacitor C3, which respectively utilize transistor switches SW1 and SW3 to selectively conduct the capacitor paths between the positive output terminal Vo+ of the differential pair and the ground. Second and fourth controlled capacitor paths are respectively provided with a second capacitor C2 and a fourth capacitor C4, which respectively utilize transistor switches SW2 and SW4 to selectively conduct the capacitor paths between the negative output terminal Vo− of the differential pair and the ground. Via the capacitance controlling signal, the transistor switches SW1, SW2, SW3 and SW4 are controlled to provide predetermined capacitance from the switched capacitance bank. For example, when the four transistor switches SW1, SW2, SW3 and SW4 are turned on, the capacitance output from the switched capacitance bank is C1+C2+C3+C4. Preferably, the capacitors C1, C2, C3 and C4 are realized by n-type transistors. Each n-type transistor has a source and a drain thereof coupled to each other, and the gate and the drain thereof forming two terminals of the capacitor.

Figure 7:
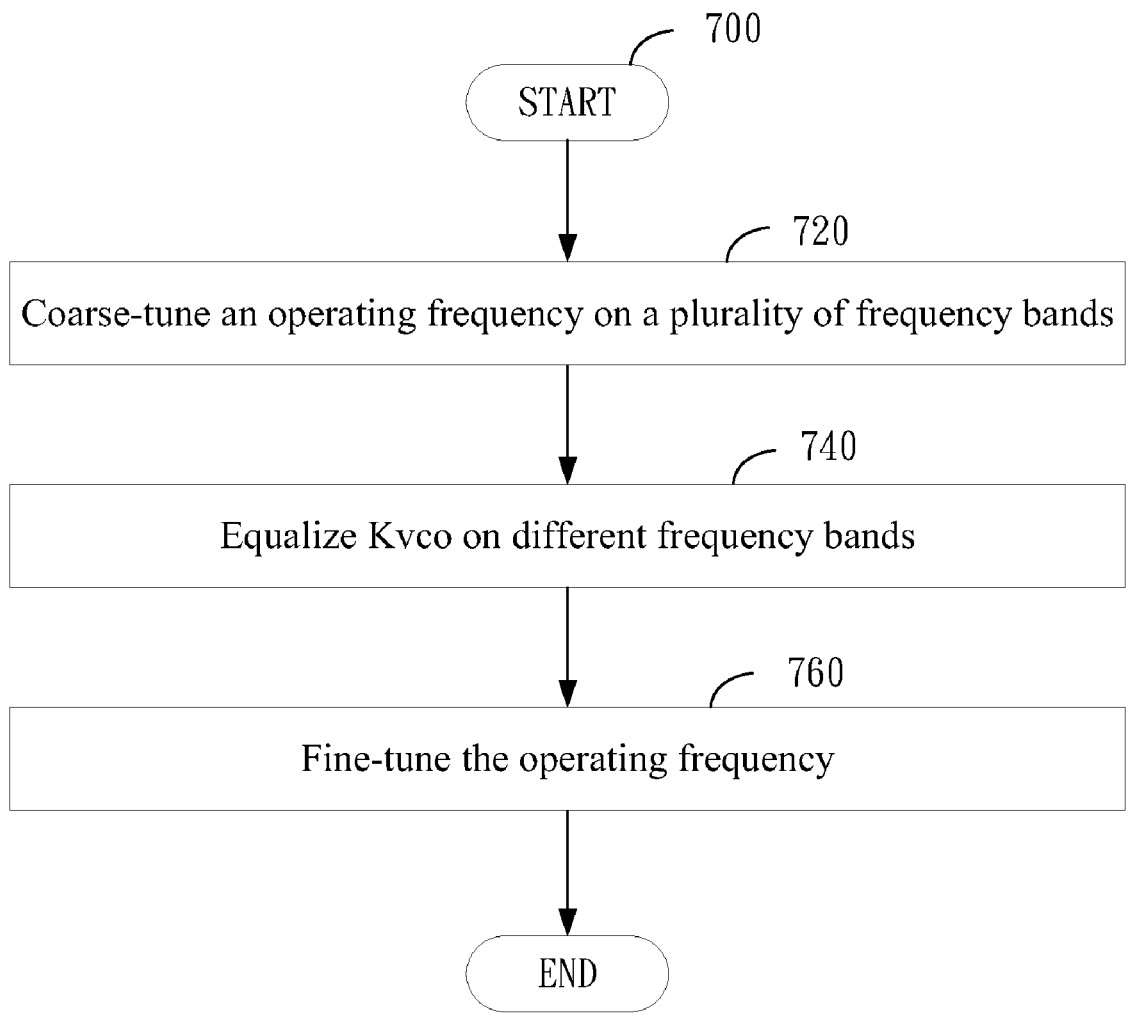
FIG. 7 is a flowchart of a method for adjusting an operating frequency of a ring oscillator according to one embodiment of the invention.

FIG. 7 is a flowchart of a method for adjusting an operating frequency of a ring oscillator according to one embodiment of the invention. The ring oscillator comprises a plurality of delay cells. The method starts with Step 700. In Step 720, an operating frequency is coarse-tuned on a plurality of frequency bands. For example, different capacitance values are provided utilizing a switched capacitance bank to allow the ring oscillator to adjust the operating frequency on different frequency bands. In Step 740, Kvco values on different frequency bands are equalized such that the Kvco values on the various frequency bands are substantially the same. For example, a compensation current is provided to the switched capacitance bank such that Kvco values on the frequency bands are substantially the same. Preferably, the compensation current gets larger as the equivalent capacitance of the switched capacitance bank gets greater. In Step 760, the operating frequency is fine-tuned. For example, the voltage level of the voltage controlling signal is controlled to fine tune the operating frequency of the ring oscillator.

In the foregoing embodiment, the delay cells are illustrated with a differential amplifier realized utilizing p-type transistors, in conjunction with a switched capacitance bank and a Kvco equalizer. For a person having ordinary skill in the art, modifications can be made by utilizing a differential amplifier realized with n-type transistors, in conjunction with a switched capacitance bank and a Kvco equalizer.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A delay cell for use in a ring oscillator, comprising:
   a differential amplifier, for generating a differential output at the output ends, comprising:
      a positive input terminal, a negative input terminal, a positive output terminal, and a negative output terminal;
      a differential pair, comprising a first current source, a first PMOS transistor, a second PMOS transistor, and a third PMOS transistor;
      wherein:
         the first current source is coupled between a voltage supply and the third PMOS transistor source;
         the gate of the third PMOS transistor is inputted with an inverted voltage controlling signal;
         the drain of the third PMOS transistor is coupled to the source of the first PMOS transistor and the source of the second PMOS transistor;
         the gate of the first PMOS transistor is the positive input terminal;
         the gate of the second PMOS transistor is the negative input terminal; and
         the drain of the first PMOS transistor is the positive output terminal, and the drain of the second PMOS transistor is the negative output terminal;
   a switched capacitance bank, coupled to the differential amplifier, for providing capacitance according to a capacitance controlling signal; and a Kvco equalizer, coupled to the differential amplifier, for generating an adjustable current at the output ends of the differential amplifier according to a current controlling signal, comprising:
  an adjustable current source comprising:
    a fixed current providing path, implementing a fixed current transistor resistor which causes the fixed current providing path to provide a fixed current; and
    a plurality of controlled current paths coupled between a voltage supply and a node, each controlled current path implementing a corresponding resistor and transistor switch for selectively conducting the controlled current paths between the voltage supply and the node; and
  a fourth PMOS transistor;
  a fifth PMOS transistor; and
  a sixth PMOS transistor;
  wherein:
    the source of the sixth PMOS transistor is coupled to the node;
    the gate of the sixth PMOS transistor is inputted with a voltage controlling signal;
    the drain of the sixth PMOS transistor is coupled to the source of the fourth PMOS transistor and the source of the fifth PMOS transistor;
    the gate of the fourth PMOS transistor is coupled to the drain of the fifth PMOS transistor drain and the negative output terminal; and
    the gate of the fifth PMOS transistor is coupled to the drain of the fourth PMOS transistor and the positive output terminal;
  wherein the current controlling signal controls the transistor switches to further control the output current magnitude of the adjustable current source;
  wherein the current control signal associates with the capacitance control signal and the Kvco values are equalized on a plurality of frequency bands.

2. The delay cell as claimed in claim 1, wherein the differential amplifier further comprises a first load, and a second load;
  wherein the first load is coupled to the positive output terminal, and the second load is coupled to the negative output terminal.

3. The delay cell as claimed in claim 1, wherein the switched capacitance bank comprises a plurality of controlled capacitor paths, and selectively connect the controlled capacitor paths to the positive output terminal or the negative output terminal according to the capacitance controlling signal.

4. The delay cell as claimed in claim 2, wherein the adjustable current source generates the adjustable current according to the current controlling signal to compensate currents flowing though the first load and the second load.

5. The delay cell as claimed in claim 4, wherein the capacitance controlling signal and the current controlling signal are simultaneously controlled, whereby the adjustable current generated by the Kvco equalizer gets larger when the capacitance output from the switched capacitance bank gets larger.

6. The delay cell as claimed in claim 3, wherein the plurality of controlled capacitor paths are parallel to each other, each controlled capacitor path comprises a transistor switch and a capacitor, and the transistor switch selectively connects the capacitor in the switched capacitance bank according to the capacitance controlling signal.

7. The delay cell as claimed in claim 6, wherein the transistor switches and the capacitors are n-type transistors.

8. The delay cell as claimed in claim 1, wherein the controlled current paths are selectively connected to the fixed current providing path in parallel according to a current controlling signal.

9. The delay cell as claimed in claim 8, wherein the resistor is a long-channel PMOS transistor.

* * * * *